(12) United States Patent
Winterschladen et al.

(10) Patent No.: US 12,324,104 B2
(45) Date of Patent: Jun. 3, 2025

(54) METHOD FOR MACHINING WORKPIECES

(71) Applicant: Skybrain Vermögensverwaltungs GmbH, Rödermark-Oberroden (DE)

(72) Inventors: Markus Winterschladen, Kahl (DE); Andreas Bretz, Darmstadt (DE)

(73) Assignee: Skybrain Vermögensverwaltungs GmbH, Rödermark-Oberroden (DE)

( * ) Notice: Subject to any disclaimer, the term of this patent is extended or adjusted under 35 U.S.C. 154(b) by 84 days.

(21) Appl. No.: 18/068,785

(22) Filed: Dec. 20, 2022

(65) Prior Publication Data
US 2023/0119865 A1    Apr. 20, 2023

Related U.S. Application Data

(62) Division of application No. 17/318,065, filed on May 12, 2021, now Pat. No. 11,963,305.

(30) Foreign Application Priority Data

May 14, 2020    (DE) .......................... 102020113134.8

(51) Int. Cl.
*H05K 3/00* (2006.01)
*B23B 35/00* (2006.01)
(Continued)

(52) U.S. Cl.
CPC ........... *H05K 3/0047* (2013.01); *B23B 35/00* (2013.01); *B23B 39/06* (2013.01); *B23B 39/08* (2013.01);
(Continued)

(58) Field of Classification Search
CPC ............... H05K 3/0047; H05K 3/243; H05K 2203/0207; H05K 1/0251; H05K 3/429;
(Continued)

(56) References Cited

U.S. PATENT DOCUMENTS 4,708,545 A * 11/1987 Fujii ...................... B23Q 35/02
                                                    408/1 R
4,789,770 A * 12/1988 Kasner ............... B23K 26/0613
                                                    219/121.75
(Continued)

FOREIGN PATENT DOCUMENTS

CN         110868803 A     3/2020
DE       102005053202 A    5/2007
(Continued)

*Primary Examiner* — Jeffrey T Carley
*Assistant Examiner* — Jose K Abraham
(74) *Attorney, Agent, or Firm* — McDonnell Boehnen Hulbert & Berghoff LLP

(57) ABSTRACT

The disclosure relates to a machining station for machining platelike workpieces (1) by means of at least one tool (10, 13, 14). The machining station has a measuring device (16) for acquiring data relating to the position of bores, a drill (10, 13, 14) for generating bores in the workpiece (1), and a data processor (17) for processing data of the at least one measuring device (16) and/or for controlling the at least one drill (10, 13, 14). The data processor (17) is here suitable and set up for performing an adjustment between a desired drilling position and/or a desired bore depth and an actual position and/or actual depth as determined by the at least one measuring device (16) for a bore present in the workpiece (1), and adapting the drilling position and/or bore depth for generating bores by means of the at least one drill (10, 13, 14).

4 Claims, 2 Drawing Sheets

(51) Int. Cl.
*B23B 39/06* (2006.01)
*B23B 39/08* (2006.01)
*B23Q 17/22* (2006.01)

(52) U.S. Cl.
CPC ...... *B23Q 17/2233* (2013.01); *B23B 2270/48* (2013.01); *H05K 2203/0207* (2013.01)

(58) Field of Classification Search
CPC ..... B23B 35/00; B23B 41/02; B23B 2228/41; B23B 2260/0482; B23B 2270/48; B23Q 17/2233; B26F 1/16
See application file for complete search history.

(56) References Cited

U.S. PATENT DOCUMENTS

| | | | | | |
|---|---|---|---|---|---|
| 4,790,694 | A | * | 12/1988 | Wilent | H05K 3/4638 408/1 R |
| 5,111,406 | A | * | 5/1992 | Zachman | H05K 3/4638 408/1 R |
| 5,154,546 | A | * | 10/1992 | Neumann | H05K 3/0008 700/192 |
| 5,369,491 | A | * | 11/1994 | Schneider | H05K 3/4638 356/626 |
| 5,529,441 | A | * | 6/1996 | Kosmowski | H05K 3/4638 408/1 R |
| 5,741,096 | A | * | 4/1998 | Olds | B23Q 17/22 408/1 R |
| 6,030,154 | A | * | 2/2000 | Whitcomb | H05K 3/4638 700/193 |
| 6,109,840 | A | * | 8/2000 | Raiteri | H05K 3/0008 408/69 |
| 6,819,789 | B1 | * | 11/2004 | Kantor | H05K 1/0269 250/559.3 |
| 2007/0114210 | A1 | | 5/2007 | Reinhold | |
| 2008/0050187 | A1 | * | 2/2008 | Kilwin | B23B 35/00 408/1 R |
| 2009/0026169 | A1 | * | 1/2009 | Cho | H05K 3/4679 219/121.6 |
| 2014/0093321 | A1 | * | 4/2014 | Liu | B23B 41/14 408/1 R |
| 2015/0245494 | A1 | * | 8/2015 | Araki | H05K 3/0047 408/1 R |
| 2015/0359110 | A1 | * | 12/2015 | Wright | H05K 3/0047 29/593 |
| 2015/0362547 | A1 | | 12/2015 | Moran | |
| 2016/0052068 | A1 | | 2/2016 | Winterschladen | |
| 2016/0259318 | A1 | * | 9/2016 | Vogt | B23Q 17/2428 |

FOREIGN PATENT DOCUMENTS

| | | | | |
|---|---|---|---|---|
| DE | 102006033625 A1 | | 1/2016 | |
| JP | 2003251508 A | | 9/2003 | |
| JP | 2007134707 A | | 5/2007 | |
| JP | 2011100960 A | * | 5/2011 | ........... H05K 3/0047 |

* cited by examiner

Copper-plated bore for contacting two inner layers

Drilled back connection

Remaining stubs (stubs)

ical of U.S. patent
METHOD FOR MACHINING WORKPIECES

CROSS-REFERENCE TO RELATED APPLICATIONS

The present application is a divisional of U.S. patent application Ser. No. 17/318,065, filed May 12, 2021, which claims priority to and the benefit of German Patent Application No. 10 2020 113 109.7 filed on May 14, 2020, the entire contents of each of which are incorporated herein by reference.

FIELD

The present disclosure relates to a machining station for machining platelike workpieces by means of tools, for example to a drilling or milling station for machining circuit boards, as well as to a method for machining platelike workpieces.

BACKGROUND

Figure 1:
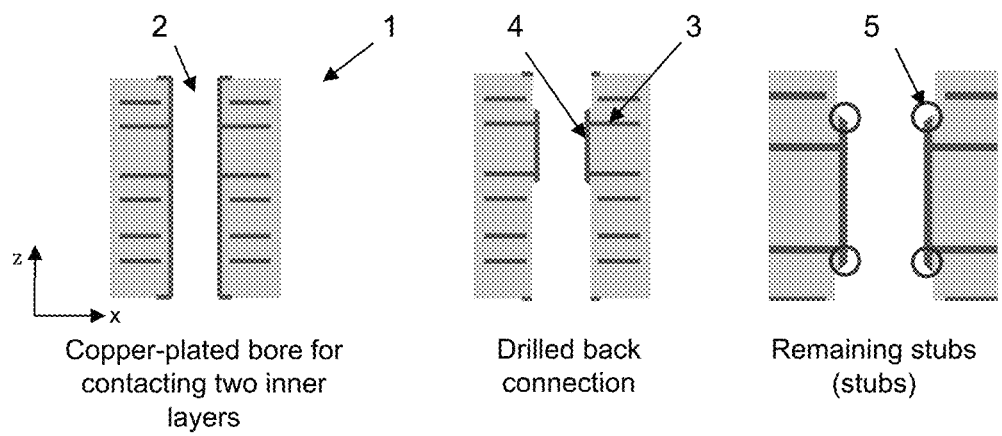

Modern circuit board products require a precise manufacture of bores, so as to ensure the functionality of the product. For example, the bores are copper plated, and serve to establish connections between the individual layers of a circuit board. A bore in a circuit board 1 with conducting layers offset relative to each other in the thickness direction is shown on FIG. 1 in various operating states. Shown on the left hand side of FIG. 1 is a plated-through bore 2, which connects two inner layers 3 with each other. In applications in the high frequency range (>5 GHz), the long, protruding ends of the actual connection 4, here a copper layer, produce disturbances in the signal. For this reason, the bores 2 are once again drilled open to a larger diameter, so that the copper layer is removed. The remaining stubs 5 (stubs) should have as defined a length as possible. Stubs 5 that are too long have a negative influence on the electrical signal, while stubs 5 that are too short cause mechanical problems, since they are not held in the bore. This process is also called "back drilling".

This back drilling can be performed in different variants. In the simplest case, drilling takes place to a predetermined depth. However, this does not take into consideration that the layers do not lie in the nominal z-position owing to the pressing operation, and the thickness of the circuit board varies.

Therefore known from US 2016/0052068 A1 is a method that makes it possible to generate deep bores, which are based on information from the through bores, and lead to a more precise drilling result through the detection of reference layers.

Figure 2:
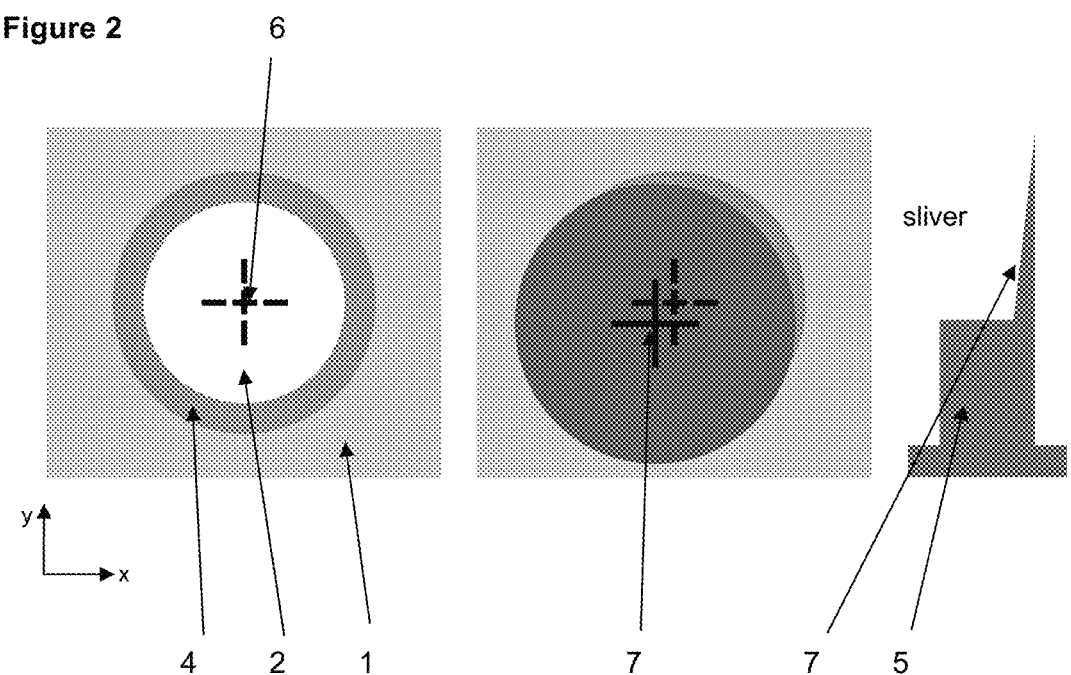

Another source of uncertainty involves the actual drilling process. Due to the positioning accuracy of the drilling machine, deviations in the positioning of the circuit board on the machine table, flexibility of the drill, contamination, etc., the pilot hole is not set exactly at the desired location in relation to the plane of the platelike workpiece (deviates in the x- and y-direction). However, the small differences between the pilot hole diameter and the diameter while back drilling result in a very small process window. FIG. 2 shows the copper-plated through bore 2 with a copper layer 4 on the left, and the ideal position of the drill 6 positioned thereover in the middle, denoted by a dashed cross. Errors arising from the through bore drilling process and the positioning accuracy of the drilling machine while back drilling can now result in the copper 4 not being completely removed while back drilling. Shown on the right of FIG. 2 is the resultant stub 5 with an undesired sliver 7 (sliver).

SUMMARY

By contrast, the object of the present disclosure is to provide a machining station as well as a method for machining circuit boards or similar platelike workpieces that avoid the aforementioned negative influences on accuracy while back drilling or during other machining steps.

This object is achieved based on the disclosure with a machining station methods described herein.

For example, a drilling station for machining at least one circuit board is a machining station for machining platelike workpieces by means of at least one tool.

In one exemplary embodiment, such a machining station can have at least one measuring device for acquiring data relating to the position of bores, in particular reference bores and/or through bores, in the workpiece, at least one drill for generating bores, in particular through bores and/or deep bores, in the workpiece, and at least one data processor for processing data of the at least one measuring device and/or for controlling the at least one drill. In order to machine more precisely in relation to the actual position of layers or bores, the at least one data processor can be suitable and set up for performing an adjustment between a desired drilling position and/or a desired bore depth and an actual position and/or actual depth as determined by the at least one measuring device for a bore present in the workpiece or a coating within the bore, and adapting the drilling position and/or bore depth for generating bores by means of the at least one drill.

To this end, it is preferred that the at least one measuring device and/or the at least one data processor be suitable and set up for registering the workpiece. This type of a registration serves to acquire data about the presence and possibly the position of layers, bores, and the like within the workpiece. Such information can be in part not visually detected from outside the workpiece, or only to a limited extent. Before a through bore is introduced into the workpiece, information about at least one point inside of the workpiece can be acquired for adapting the drilling position.

This registration process can comprise an analysis of the entire circuit board, so as to ascertain the displacement of the individual layers relative to each other. For example, this can take place using X-rays. The position of one or several reference bores is then preferably derived from the measurement data. For example, the reference bores are here introduced beforehand in such a way as to produce the best possible averaging over all layers, so as to drill through the individual layers as precisely as possible while through drilling the desired contact points.

In an embodiment, the at least one drill can have a device for detecting selected inner layers as a reference. In particular, the drill is designed in such a way that inner layer detection can take place while generating through bores for the subsequent copper-plating operation. This can happen in several steps, e.g., the panel can be turned to drill from the front and back. Information is here preferably recorded about the actual z-position of the individual layers, for example as described in US 2016/0052068 A1.

The at least one data processor can be suitable and set up for adapting the bore depth based on the measurement data from detecting selected or all inner layers. As an option, the bore positions of the through bores, i.e., the x- and y-position in a circuit board surface, can also be measured.

According to an independent inventive idea, copper plating the circuit board is followed by measuring the bores, so as to minimize the effects of offsets while back drilling. The at least one measuring device and/or the at least one data processor is preferably suitable and set up for measuring the bores after copper-plating a circuit board. Different variants are possible to this end: In a first example, the measurement can take place offline on a separate measuring machine of the machining station according to the disclosure by means of a measuring method involving incident light, transmitted light or tactilely. Alternatively or additionally, the measurement can take place online on the drilling machine of the machining station according to the disclosure by means of a suitable method, for example with a CCD camera of the machining station.

The scope of measurements in the machining station according to the disclosure can here also vary. In a first example, the machining station can be set up to only measure selected reference bores. It is further possible to set up the machining station according to the disclosure to measure all bores. However, this can take a long time when measuring on the drilling machine. In another example, the machining station according to the disclosure can be set up to measure several or all bores by means of a zone scanning method, i.e., the CCD camera records an image with several bores, and evaluates it through information processing in such a way that the midpoints of all acquired bores can be determined accurately enough. Finally, it is possible in one example to set up the machining station according to the disclosure in such a way as to measure all bores in selected areas with a high density of bores, for example ball-grid arrays. The selected areas are here preferably determined intelligently by means of the data processor.

The at least one data processor can further be suitable and set up to adapt the bore position and/or drilling depth based on the measurement data from measuring the bores after copper plating a circuit board. The bore positions (x- and y-coordinates) are here adapted based on the measurement data with the objective of drilling the deep bores in the back drilling process as precisely in the middle of the pilot hole as possible. Depending on the measuring method, an averaged adaptation of all bore positions can here take place based on information about the reference bores, or a direct adaptation of the respective bore can take place via the data, or a direct adaptation of the measured bores and an averaged adaptation of the remaining bores can take place. In addition, the bore depth can be calculated based upon the data acquired while generating passage bores, for example separately for each bore.

A method according to the disclosure is suitable for machining platelike workpieces, in particular for machining circuit boards in a machining station of the aforementioned kind. The method preferably has the following steps: Preparing at least one platelike workpiece, determining the position of reference bores in the at least one platelike workpiece, introducing through bores into the at least one platelike workpiece, wherein the bore positions of the through bores are simultaneously or subsequently ascertained, after continued machining, in particular after copper plating the circuit board, again measuring the bore positions of the, for example copper plated, through bores, adapting the bore positions and/or the bore depth based on the data ascertained in the preceding steps, and introducing deep bores into the platelike workpiece based on the adapted data for the bore positions and/or bore depth. In other words, the bore coordinates can be adapted in all three spatial directions based on a method according to the disclosure.

Regardless of the specific configuration of the machining station, one essential aspect of the present disclosure thus involves the process chain with the different embodiments of the measuring methods, and accordingly the various downstream compensation processes, so as to arrive at the ideal combination of methods depending on the application and workpiece.

Another independent inventive idea relates to providing interfaces in the individual components of the machining station according to the disclosure along the process chain, so as to be able to exchange data between the measurement, processing, and machining steps. Use can here also be made of algorithms that allow an intelligent selection of the bores to be acquired during zone scanning.

According to the disclosure, the bore coordinates are advantageously adapted in all three spatial directions via the combination of information from the process steps of registration, through drilling and measurement (before and/or after copper-plating the through bores). This enables an adapted deep drilling (adapted depth drilling) based on adjusting the bore position and bore depth.

The disclosure will be described in more detail below based on exemplary embodiments and the drawing. All described and/or graphically depicted features here comprise the subject matter of the disclosure, whether taken separately or in any combination, regardless of how summarized in the claims or back referenced.

BRIEF DESCRIPTION OF THE DRAWOINGS

Figure 3:
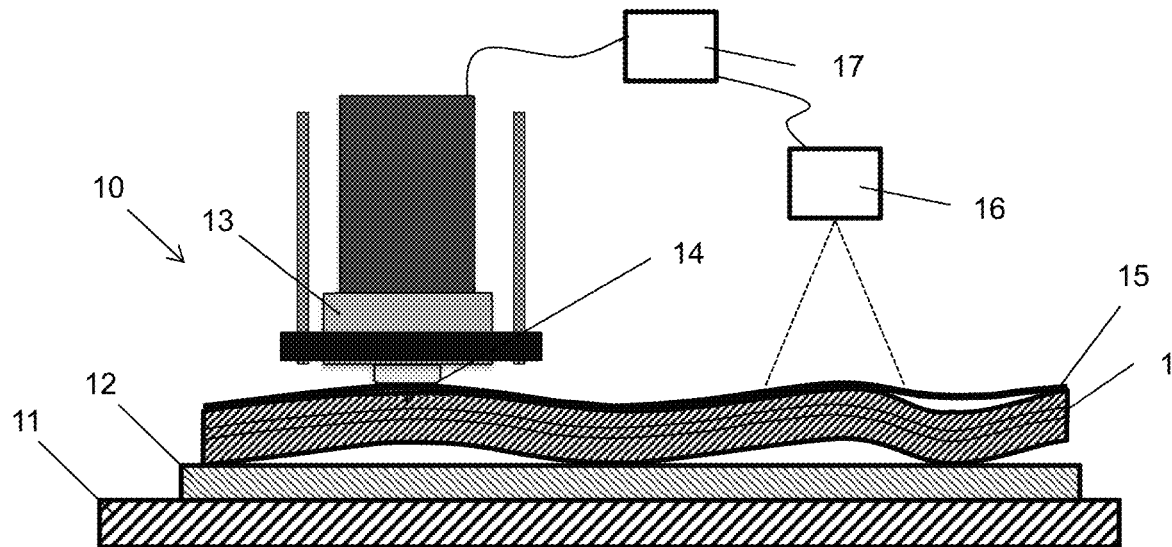
Figure 4:
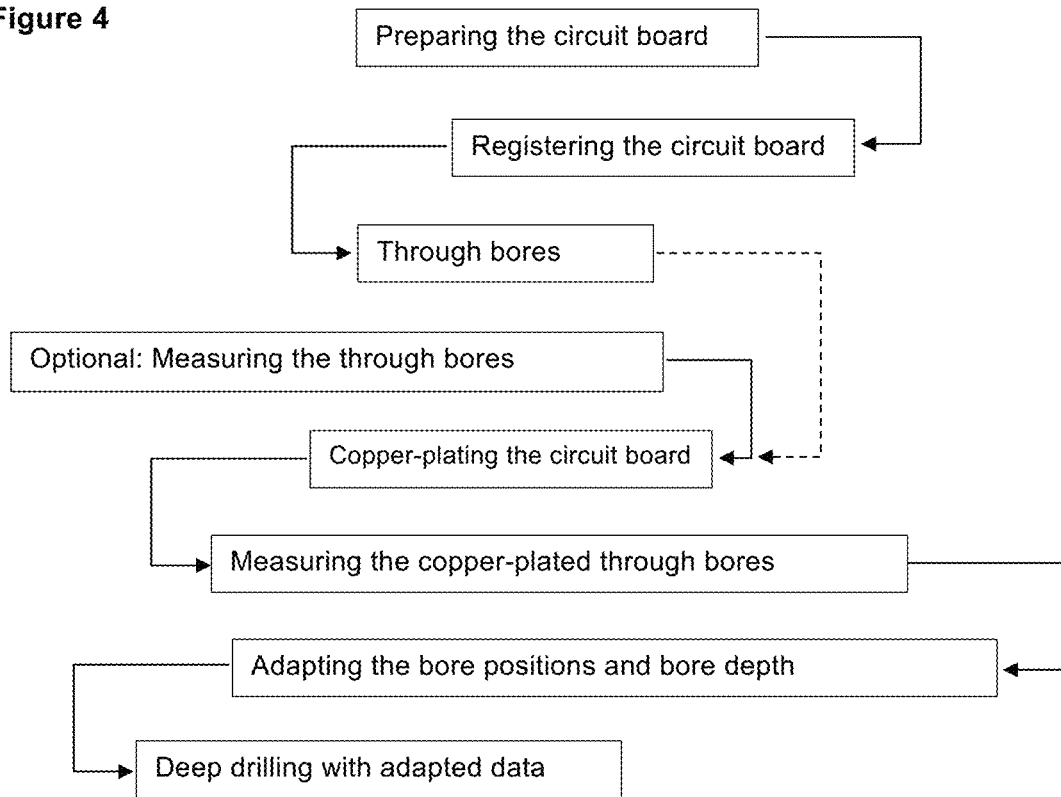

FIG. 1 are sectional views of a bore in a circuit board;
FIG. 2 are top views or a side view of a bore;
FIG. 3 is a schematic of the machining station according to the disclosure, and
FIG. 4 are the steps of a method according to the disclosure.

DETAILED DESCRIPTION

FIG. 3 shows a machining station with a machining device, for example a drilling machine 10, which has a flat table 11 and an underlay (backup) 12 provided thereon. The drilling machine 10 further has at least one drill spindle 13 with a drill (drilling tool) 14. Placed on the underlay 12 is a workpiece 1, for example a sandwich component, such as a circuit board, which in the illustration on FIG. 3 is exaggeratedly strongly corrugated. The workpiece 1 usually involves an essentially platelike component, which has uneven surfaces of in part several tenths of a millimeter, depending on the plate thickness. In turn, a cover layer (entry) 15 lies on the workpiece 1. As opposed to the illustration on FIG. 3, a carrier or the like can be provided between the table 11 and the underlay 12, for example. It is further possible for the cover layer to have a multiplayer design, e.g., with an electrically conductive uppermost layer. In the illustration on FIG. 3, the width of the component is the X-direction, and the thickness of the component is the Z-direction, for example.

The machining station further has a measuring device 16, which is suitable for nondestructively inspecting the workpiece 1. The measuring device 16 is connected with a data processor 17, which is also connected with the drilling machine 10.

The machining station is suitable for carrying out individual steps in the process chain of the ensuing procedure, the steps and sequence of which are schematically depicted on FIG. 4.

According to one exemplary embodiment, the process chain for manufacturing circuit boards with deep bores can have the following steps, among others:

1) Initially, various upstream steps can be carried out for manufacturing and preparing the circuit board (exposure, etching, pressing, . . . ). This most often does not take place in the machining station.
2) The circuit board is then registered. In this analysis of the entire circuit board, the displacement of individual layers relative to each other is determined. For example, this can be done with X-rays. The position of reference bores is derived from the measurement data. The reference bores are introduced in such a way as to produce the best possible averaging over all layers, so as to drill through the desired contact points of the individual layers while drilling. Information about support points inside of the circuit board can be gleaned from the registration process for subsequent adaptation of the x- and y-positions. This can also take place outside of the machining station.
3) This is followed by through drilling, i.e., generating through bores for subsequent copper plating. This can happen in several steps, e.g., the panel can be turned for drilling from the front and back. Information is here recorded about the actual z-position of the individual layers (for example as described in US 2016/0052068 A1). Through drilling with inner layer detection can take place on a corresponding machine with a special device for detecting selected inner layers as the reference.
4) As an option, the bore positions of the through bores can be measured before the latter are further machined, in particular coated on the interior.
5) The circuit board is preferably copper plated outside of the machining station according to the disclosure.
6) Additionally or alternatively to the measurement in step 4, the bore positions of the copper plated through bores are then measured. The bore positions are measured before and/or after copper plating the circuit board so as to minimize the effects of offsets in the back drilling process. Different variants are possible for this purpose:
a) offline on a separate measuring machine using a measuring method such as incident light, transmitted light or tactilely (in steps 4+6),
b) online on the drilling machine using a suitable method, for example with a CCD camera of the kind already used on machines today (only in step 6).

The scope of measurements can here also vary:
c) only selected reference bores (variants a and b),
d) all bores (variants a and b),
e) all bores by means of a zone scanning method (variant b), i.e., the CCD camera records an image with several bores, and evaluates it through information processing so that the midpoints of all acquired bores can be determined sufficiently accurately,
f) all bores in selected areas with a high density of bores (for example, ball-grid array; the selected areas are intelligently determined) (variants a and b).

7) The bore positions are subsequently compared using the measurement results in the data processor and adjusted as needed. The drilling positions (x- and y-coordinates) are adjusted based on the measurement data from step 6. The objective is to drill the deep bores of the back drilling process as precisely in the middle of the pilot hole as possible. Depending on the measuring method, all bore positions are here either adjusted via averaging based on information about the reference bores (variant c), or the respective bore is directly adjusted using data from variants d and e, or the measured bores are directly adjusted, and the remaining bores are adjusted via averaging (variant f).
8) Based on the data from step 3, the bore depth is additionally calculated and adjusted as needed separately for each bore (e.g., as described in US 2016/0052068 A1).
9) Deep drilling then takes place with the adapted data. The program with the information from steps 7 and 8 is used on a machine 10 to perform a deep drilling to a prescribed depth at the adapted positions.

The invention claimed is:

1. A method for machining platelike workpieces (1), wherein the method has the following steps:
   a) preparing at least one platelike workpiece (1) comprising reference bores,
   b) generating, via a measurement device (16) with an optical system, measurement data for the workpiece (1), thereby determining a reference-bore-position of reference bores in the at least one platelike workpiece (1),
   c) introducing a plurality of through-bores (2) into the at least one platelike workpiece (1), wherein machined through-bore-positions of the plurality of through-bores (2) are ascertained by measuring the through-bore-positions via the measurement device while introducing the plurality of through-bores (2) or wherein the machined through-bore-positions of the plurality of through-bores (2) are ascertained by measuring the through-bore positions after the plurality of through-bores (2) are introduced,
   d) after continued machining, in particular after copper plating the platelike workpiece (1), again measuring the machined through-bore-positions of the plurality of through-bores (2),
   e) adapting the measured through-bore-positions and a bore depth to desired through-bore-positions and/or a desired bore depth based on data ascertained in step d) from the machined through-bore positions, and
   f) introducing deep bores into the platelike workpiece (1) based on data adapted in step e) for the desired through-bore-positions and the desired bore depth.

2. The method according to claim 1, characterized in that, in step b), data about support points inside of the platelike workpiece (1) are determined for adapting the measured through-bore-positions and bore depth in step e); and/or
in step c), information is recorded about an actual z-position of individual layers by a drill (10, 13, 14); and/or
in step d), measurement takes place offline on a separate measuring machine and/or online on a drill (10, 13, 14); and/or
in step e), an averaged adaptation of all measured through-bore-positions takes place based on information about the reference bores, a direct adaptation of the plurality of through-bores (2) takes place, or a combined direct adaptation of individual through-bores (2) and an averaged adaptation of the remaining through-bores (2) takes place.

3. The method according to claim 1, characterized in that in step d), either only selected reference bores or all bores are measured by a zone scanning method or all bores in selected areas of the platelike workpiece (1) are measured, in particular in areas with a high density of bores.

4. The method according to claim 1, characterized in that in step e), the bore depth is separately adapted to the desired depth for each through-bore (2) based on data from step c).

\* \* \* \* \*